United States Patent [19]
Moslehi

[11] Patent Number: 5,420,056
[45] Date of Patent: May 30, 1995

[54] JUNCTION CONTACT PROCESS AND STRUCTURE FOR SEMICONDUCTOR TECHNOLOGIES

[75] Inventor: Mehrdad M. Moslehi, Dallas, Tex.

[73] Assignee: Texas Instruments Incorporated, Dallas, Tex.

[21] Appl. No.: 182,897

[22] Filed: Jan. 14, 1994

[51] Int. Cl.⁶ .............................................. H01L 21/38
[52] U.S. Cl. ...................... 437/40; 437/154; 437/192
[58] Field of Search ............... 437/154, 153, 192, 40, 437/41, 247, 193; 148/DIG. 135, 141

[56] References Cited

U.S. PATENT DOCUMENTS

| | | | |
|---|---|---|---|
| 4,727,038 | 2/1988 | Watabe et al. | 437/913 |
| 4,727,045 | 2/1988 | Cheung et al. | 437/192 |
| 4,744,859 | 5/1988 | Hu et al. | 437/154 |
| 5,084,401 | 1/1992 | Hagino | 437/154 |
| 5,219,770 | 6/1993 | Shirato et al. | 437/40 |
| 5,219,783 | 6/1993 | Moslehi | 437/57 |
| 5,238,850 | 8/1993 | Matsunaga et al. | 437/192 |
| 5,256,563 | 10/1993 | Moslehi et al. | 437/152 |
| 5,298,463 | 3/1994 | Sandhu et al. | 437/192 |

*Primary Examiner*—Olik Chaudhuri
*Assistant Examiner*—S. Mulpuri
*Attorney, Agent, or Firm*—Jacqueline J. Garner; Richard L. Donaldson; William E. Hiller

[57] ABSTRACT

A device and method for forming an improved junction contact in a semiconductor device (10). A portion of an interlevel dielectric layer (28) is etched away to expose a surface of at least one junction region (26). Next, a dielectric layer is formed over the exposed surface of the junction regions (26). The semiconductor device (10) is then annealed in a nitrogen-containing ambient to diffuse a portion (34) of the at least one junction region (26) further into a substrate (12). The dielectric layer may then be removed and contact plugs (36) formed in the exposed area. Finally, a metal interconnect layer (38) may be formed to connect to the junction regions (26) through the contact plugs (36).

21 Claims, 3 Drawing Sheets

JUNCTION CONTACT PROCESS AND STRUCTURE FOR SEMICONDUCTOR TECHNOLOGIES

FIELD OF THE INVENTION

This invention generally relates to semiconductor processing and more specifically to improved junction contact formation processes and structures.

BACKGROUND OF THE INVENTION

As semiconductor devices become more dense, there is a desire to make device junction regions such as complimentary metal-oxide semiconductor (CMOS) source/drain regions shallower. In addition, advanced semiconductor technologies (such as CMOS and BiCMOS) require low-resistance contacts to high quality device junctions to improve device performance. As the junction regions become shallower, it becomes harder to make contact to the junction regions without significantly increasing the junction electrical leakage current. It is desired to keep the $p^+n$ and $n^+p$ junction leakage current minimal in order to reduce the overall chip power consumption and improve the device manufacturing yield. The device junction leakage is influenced by numerous factors including substrate damage and overetch during the contact etch process.

The device contact etch processes are usually anisotropic based on reactive ion etching (RIE) and can generate damage to the substrate and silicon overetch in the contact region. During the etch, various species (hydrogen, carbon, etc.) get implanted into the junction regions near the contact surface. Increased junction leakage occurs when electrically active defects exist close to the $p^+n$ or $n^+p$ junction space charge region. Moreover, the contact etch processes usually employ as much as a 50–100% overetch to ensure cleared contact holes over the entire wafer surface. Although the contact oxide etch is typically selective against silicon, some loss of silicon underneath the contact holes occurs during the overetch period. The combination of silicon loss due to overetch and the RIE-induced substrate damage can cause serious junction leakage problems. The increased junction leakage is due to the electrically active defects within the junction space charge or depletion region. Moreover, the subsequent contact silicidation process used to obtain low contact resistance can increase the possibility of junction leakage problem due to the silicon consumption by the contact silicide. In order to avoid the contact related junction leakage problems, the heavily doped source/drain junctions must be made deep enough such that all the substrate defects generated by the contact etch damage and substrate overetch remain above and outside the junction depletion region. This requirement, however, can result in increased punch-through leakage (unwanted leakage through the channel from source to drain) in MOSFETs which, in turn, limits the scalability of the device. Accordingly, there is a need for a method to form low leakage device junction without sacrificing device scalability and without degrading device performance.

SUMMARY OF THE INVENTION

A device and method for forming an improved junction contact in a semiconductor device is disclosed herein. At least one contact hole is etched in an interlevel dielectric layer to expose a portion of at least one junction region. Next, a dielectric layer is formed over the portion of the at least one junction region. The semiconductor device is then annealed in a nitrogen-containing ambient to diffuse the portion of the at least one junction region further into a substrate. The dielectric layer may then be removed and contact plugs formed in the at least one contact hole. Finally, a metal interconnect layer may be formed to connect the junction regions through the contact plugs to other device terminals in the integrated circuit.

An advantage of the invention is providing an improved low leakage device junction that does not sacrifice device scalability or degrade device performance.

Another advantage of the invention is providing an improved low leakage device junction that is self-aligned (i.e., does not require additional lithography masking steps).

Another advantage of the invention is providing an improved low leakage device junction that eliminates the junction leakage problem associated with contact etch damage, excessive silicon loss due to the contact overetch, and/or contact silicidation.

Another advantage of the invention is providing an improved low leakage device junction that is compatible with non-salicides, polycide, and salicided semiconductor technologies.

These and other advantages will be apparent to those skilled in the art having reference to the specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The preferred embodiment of the invention will be described in conjunction with an n-channel insulated-gate field-effect transistor (IGFET). It will be apparent to those skilled in the art that the invention is equally applicable to other elements (such as p-channel transistors), various process technologies (NMOS, CMOS, BiCMOS, bipolar, etc.), and various process flows (conventional, polycide or metal silicides over polysilicon, salicide or self-aligned silicide, etc.).

As device geometries become smaller, device junctions need to become shallower to reduce punch-through and subthreshold leakage. Punch-through leakage is unwanted leakage that occurs from one source/drain junction region to another through the device channel. However, the junction regions need to remain deep enough to allow for the surface substrate damage due to contact oxide etch, silicon consumption due to the overetch associated with the contact etch and silicon consumption due to contact silicidation. Thus, it is desirable to have a junction region that is shallow near the channel region and deeper below the contact.

One prior method for forming a low leakage device junction without sacrificing scalability or device performance is patterned self-aligned implantation into the device junction regions after the contact holes have been etched. The PMOS regions are masked and an n-type dopant is implanted into the NMOS contact regions. Next, the NMOS regions are masked while a p-type dopant (boron) is in implanted in the PMOS contact regions. This method allows formation of low device contact resistance without degrading the punch-through and subthreshold device characteristics. However, a disadvantage of this method is the need for two additional microlithography masking steps, and additional implantation steps resulting in additional process complexity. Thus, there is a need for a low leakage device junction method that does not sacrifice scalability or device performance and that does not unduly increase process complexity.

Figure 1:
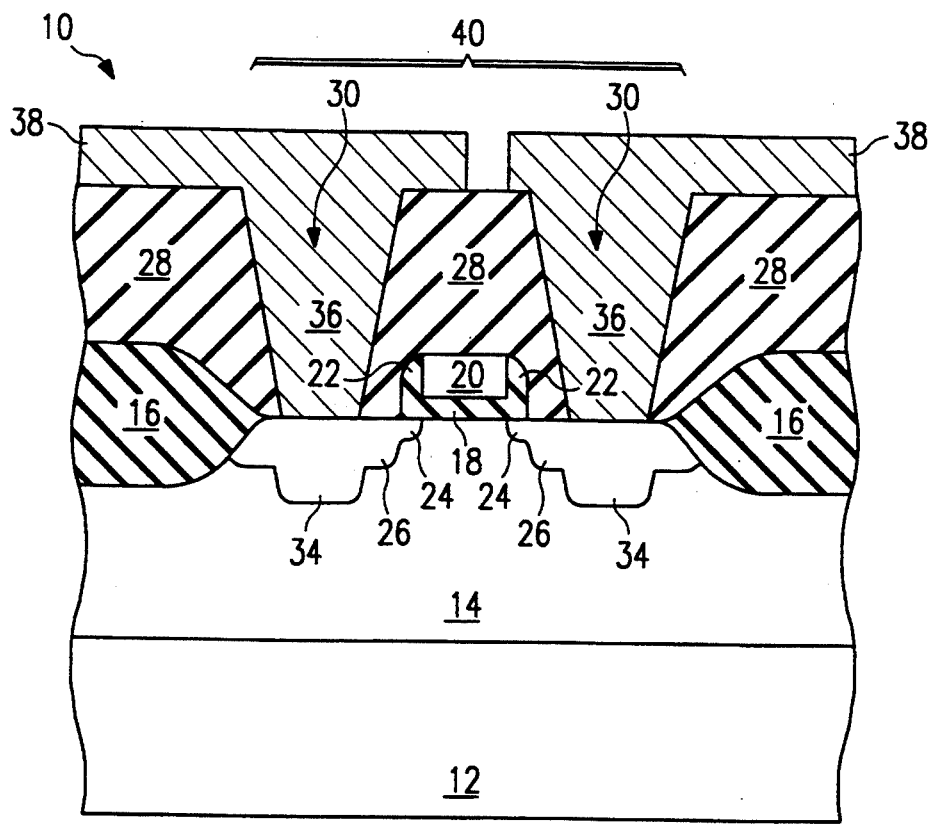
FIG. 1 is a cross-sectional diagram of a low leakage junction device according to the preferred embodiment of the invention.

An IGFET transistor having a low leakage device junction according to the preferred embodiment of the invention is shown in FIG. 1. P-well 14 is located in substrate 12 of device 10. At the surface of p-well 14, field oxide regions 16 isolate transistor 40 from other device elements (not shown). Gate electrode 20, which may, for example comprise polysilicon, is separated from the surface of p-well 14 by gate dielectric 18. Sidewall spacers 22 may be formed on the vertical edges of gate electrode 20 and may, for example, comprise oxide or nitride. Lightly doped drain (LDD) regions 24 are optional and may be located in the surface of p-well 14 below sidewall spacers 22. Self-aligned source/drain junction regions 26 are located on both sides of gate electrode 20. A portion 34 of source/drain junction regions 26 extends further into p-well 14. Portions 34 are self-aligned with contact holes 30.

Having only the portions 34 of source/drain junction regions 26 extend further into the substrate provides the advantage of low leakage junctions without increasing the punch-through or subthreshold leakage or degrading device performance. The outer portions of source/drain junction regions 26 remain as shallow as necessary to avoid increasing punch-through or subthreshold leakage. Accordingly, the scalability of device 10 is not degraded. Likewise, performance is not degraded because any silicon consumption that occurs during the contact etch or silicidation as well as any substrate damage that occurs during the contact overetch period will occur only below the contact. This is precisely the point where the portions 34 extend deeper into the substrate. Accordingly, a low leakage junction is achieved without degrading scalability or device performance.

Contact holes 30 extend through interlevel dielectric layer 28 and are filled with contact plugs 36. Interlevel dielectric layer 28 may, for example, comprise a borophosphosilicate (BPSG) layer in between two undoped oxide layers. Contact plugs 36 connect source/drain junction regions 26 with interconnect layer 38. Contact plugs 36 and interconnect layer 38 may, for example, comprise aluminum, aluminum alloy, or tungsten-plug plus aluminum metal lines.

Figure 2:
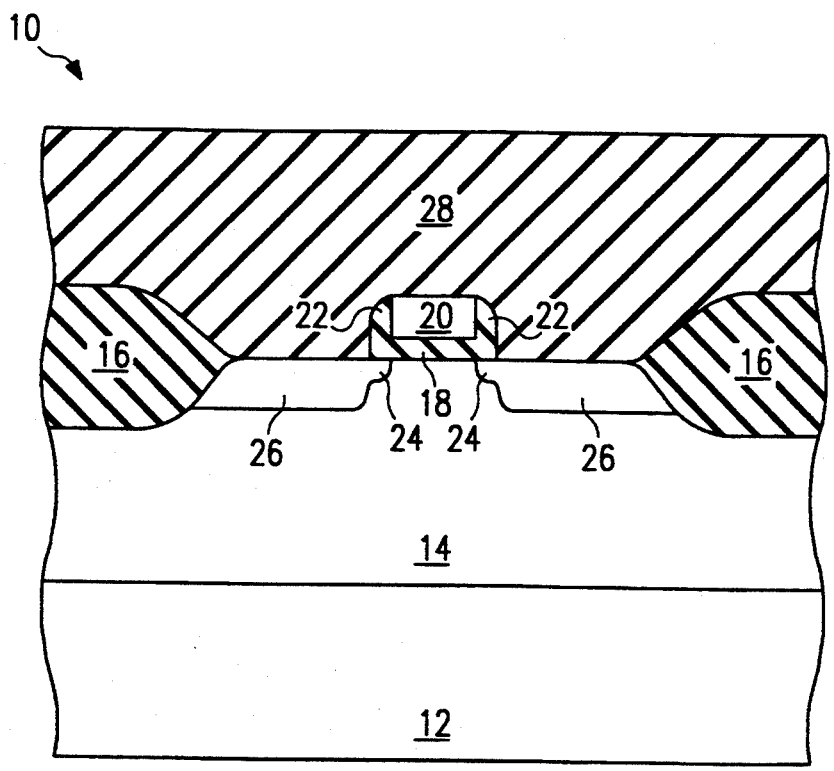
FIGS. 2–6 are cross-sectional diagrams of the low leakage device of FIG. 1 at various stages of fabrication.

FIG. 2 is a cross-sectional diagram of a semiconductor device 10 having a substrate 12 after the formation of p-well 14, field oxide regions 16, gate dielectric 18, gate electrode 20, sidewall spacers 22, lightly-doped drain (LDD) regions 24, heavily doped source/drain junction regions 26 and interlevel dielectric layer 28. It should be noted that sidewall spacers 22 and lightly doped drain (LDD) regions 24 are optional. It should also be noted that gate electrode 20 and source/drain junction regions 26 may optionally be silicided. The formation of a low leakage junction in the structure of FIG. 2 will now be described.

Figure 3:
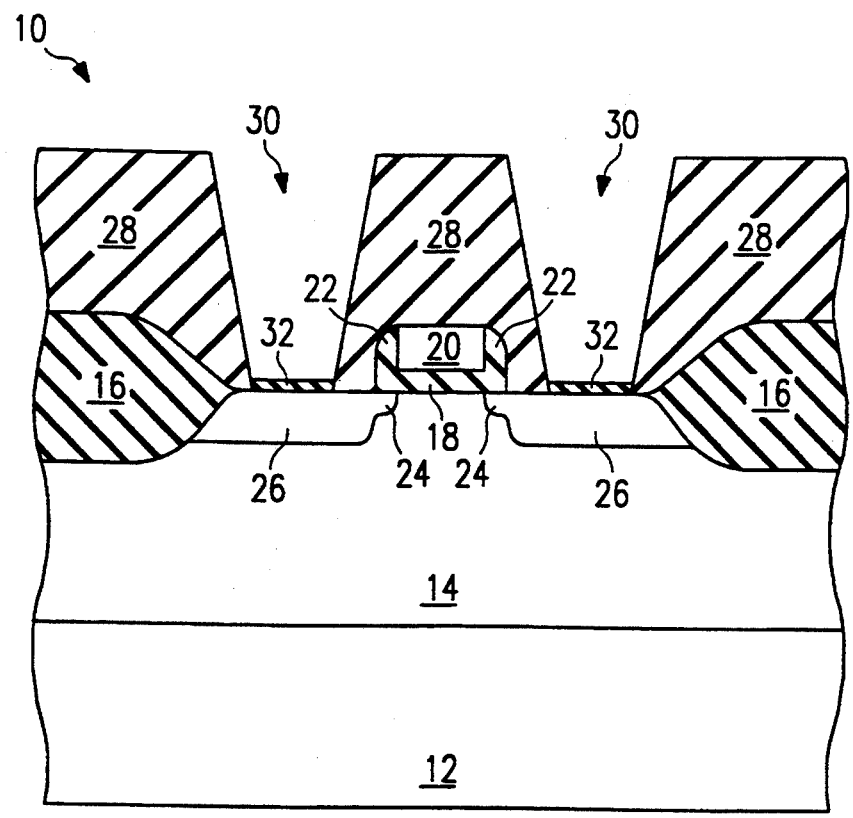

Using an anisoptropic plasma etch, contact holes 30 are etched through interlevel dielectric layer 28 to expose a portion of the surface of source/drain junction regions 26 as shown in FIG. 3. This may be followed by a wet or dry contact clean process as is well known in the art. Next, a thin oxide layer 32 is formed over the exposed surface of source/drain junction regions 26. Oxide layer 32 may have a thickness in the range of 50Å–1000Å. In the preferred embodiment, oxide layer 32 has a thickness in the range of 100Å–200Å. Oxide layer 32 may be formed by a thermal oxidation such as high-pressure steam oxidation, at a temperature of less than 850° C. Alternatively, oxide layer 32 may be deposited. Preferably, oxide layer 32 is formed by low-pressure chemical-vapor deposition (LPCVD) (using Tetraethoxysilane or TEOS). Plasma-enhanced chemical-vapor deposition (PECVD) may also be used. Low processing temperatures are desired to avoid reflow of the interlevel dielectric layer and/or dopant loss into silicide if silicided gates and/or silicided source/drain junction regions are used in the device.

Figure 4:
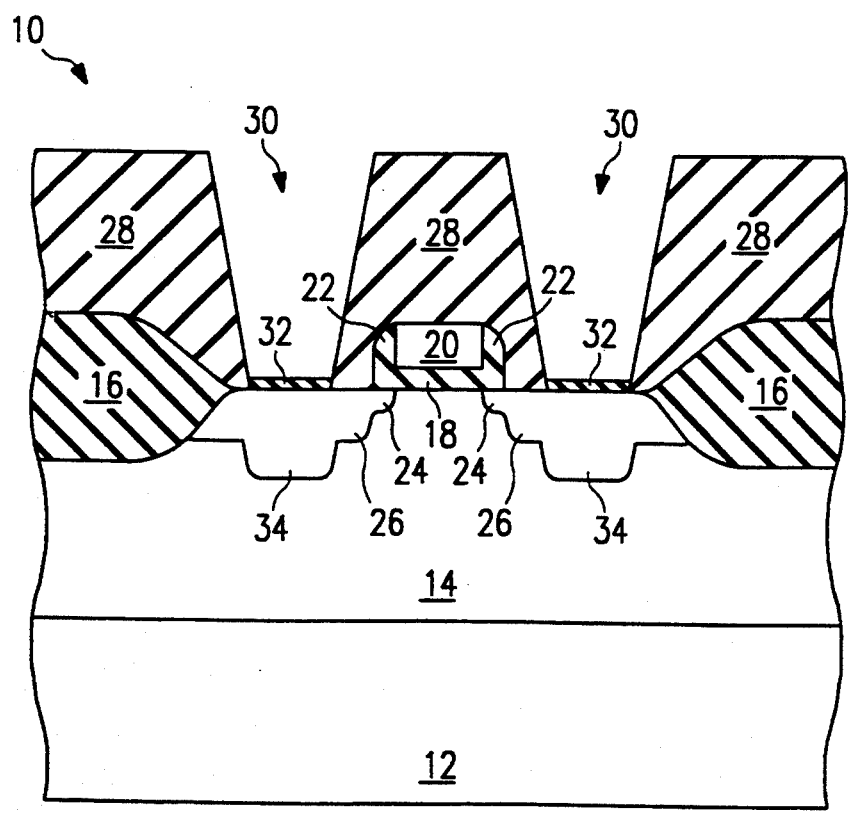

Referring to FIG. 4, semiconductor device 10 is annealed in a nitrogen-containing ambient. In the preferred embodiment, the nitrogen containing ambient is ammonia. The anneal may be performed at a temperature less than 850° C. and at a pressure in the range of below atmospheric pressure to 100 atm. Preferably, a high pressure ammonia anneal between 20 atms and 100 atms is used at a temperature less than 850° C. If a rapid thermal process (RTP) is utilized the anneal duration may be in the range of 10–300 seconds. Typically, the duration of RTP cycles will be in the range of 1 to 2 minutes. Alternatively, if batch processing is utilized, the duration of the anneal could be in the range of 10 minutes to 1 hour. The anneal in a nitrogen containing ambient produces a self-aligned oxynitridation-enhanced diffusion (ONED) effect in the source/drain junction regions 26 below the contact holes 30. This results in deeper self-aligned junctions in portions 34 of source/drain junction regions 26. The ONED effect is described in further detail in U.S. Pat. Nos. 5,219,783, issued Jun. 15, 1993 and U.S. Pat. No. 5,256,563, issued Oct. 26, 1993, both assigned to Texas Instruments, Inc. The ONED effect is significant on dopants such as boron and phosphorus. Thus, NMOS junctions made of phosphorus or arsenic/phosphorus and PMOS junctions made of boron are made deeper in a self-aligned manner. It should be noted that the effect can also occur with other dopants, such as arsenic only doped NMOS junctions. It should also be noted that both the NMOS and PMOS junctions are made deeper during a single ammonia anneal process and that additional masking and ion implantation steps are not required.

Figure 5:
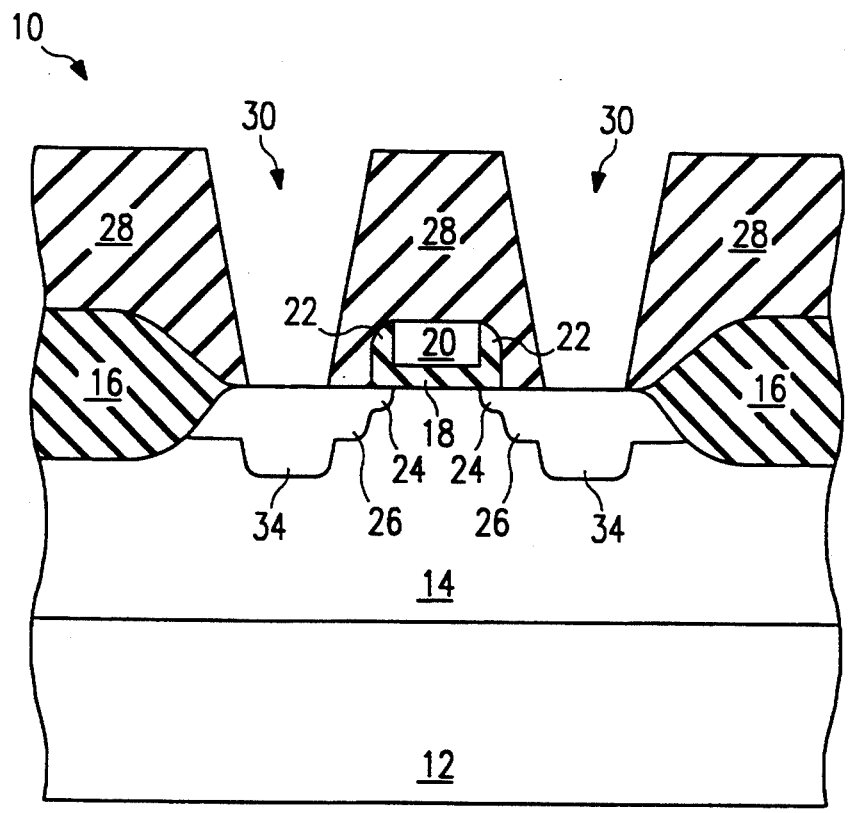

Referring to FIG. 5, oxide layer 32 is removed using an anisotropic etch. It should be noted that oxide layer 32 is actually a nitrided oxide due to the nitridation anneal preformed in the previous step. Layer 32 is preferably removed using a plasma etch. Alternatively, a wet or vapor-phase process (e.g. HF/H$_2$O) may be used.

Figure 6:
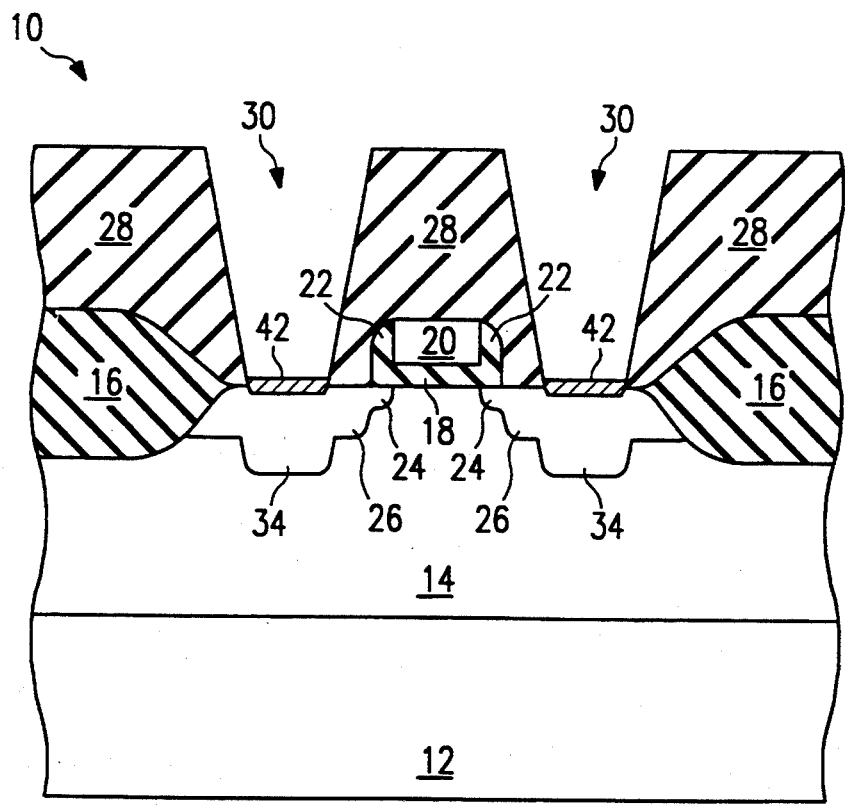

Processing then proceeds with conventional methods for forming device interconnections. For example, a silicided contact 42 may optionally now be formed at the bottom of contact 30, as shown in FIG. 6. A layer of titanium may be deposited, followed by a rapid thermal anneal to form titanium silicide at the bottom of contacts 30 and titanium nitride elsewhere. Additional titanium nitride may then be deposited by collimated reactive sputtering or chemical-vapor-deposition (CVD) as contact barrier layer. Referring back to FIG. 1, a metal such as aluminum may be deposited (e.g., by physical-vapor deposition or PVD) and reflowed to form contact plugs 36. If aluminum reflow is not used to form the contact plugs, tungsten may be deposited and etched followed by an aluminum deposition and etch to form metal interconnect lines 38. Other methods and materials for forming contact plugs 36 and metal interconnect lines 38 will be apparent to those skilled in the art.

The preferred embodiment of the invention, as described above, eliminates the junction leakage problem associated with contact etch damage, excessive silicon consumption due to the contact etch, and/or silicon consumption due to contact silicidation. The deeper self-aligned contact junctions 34 allow the use of a thicker contact refractory metal layer (e.g. 800Å titanium) for contact silicidation and formation of low resistance contacts without the risk of junction leakage. The above-described process is compatible with non-salicided, polycide, and salicided semiconductor technologies and requires no additional masking steps.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming an improved junction contact in a semiconductor device, comprising the steps of:
   a. etching at least one contact hole through an interlevel dielectric layer to expose a portion of at least one junction region;
   b. forming a dielectric layer over said portion of said at least one junction region; and
   c. annealing said semiconductor device in a nitrogen-containing ambient to diffuse said portion of said at least one junction region with said overlying dielectric layer further into a substrate.

2. The method of claim 1, wherein said nitrogen-containing ambient comprises ammonia.

3. The method of claim 1, wherein said annealing step is performed at a temperature less than 850° C.

4. The method of claim 1, wherein said annealing step is performed at a pressure in the range of below atmospheric pressure to 100 atmospheres.

5. The method of claim 1, wherein said annealing step is performed at a pressure in the range of 20 to 100 atmospheres.

6. The method of claim 1, wherein said dielectric layer has a thickness in the range of 50Å–1000Å.

7. The method of claim 1, wherein said dielectric layer has a thickness in the range of 100–Å200Å.

8. The method of claim 1, wherein said step of forming said dielectric layer comprises low-pressure chemical-vapor deposition.

9. The method of claim 1, wherein said step of forming said dielectric layer comprises thermally growing said dielectric layer using a thermal oxidation process.

10. The method of claim 1 further comprising the steps of:
   a. removing said dielectric layer;
   b. forming a contact plug in said at least one contact hole; and
   c. forming a metal interconnect layer, wherein said contact plug electrically connects said at least one junction region to said metal interconnect layer.

11. The method of claim 1, wherein said at least one junction region comprises a plurality of source/drain junction regions.

12. The method of claim 1, wherein said dielectric layer is a silicon dioxide layer.

13. A method of forming a semiconductor device, comprising the steps of:
   a. forming a plurality of transistors at the surface of a semiconductor body, each of said transistors having a source region, a drain region, and a gate;
   b. forming an interlevel dielectric layer over said plurality of transistors and said semiconductor body;
   c. etching a plurality of contact holes through said interlevel dielectric layer over said source and drain regions;
   d. forming a dielectric layer in said contact holes over said source and drain regions;
   e. annealing said semiconductor device in a nitrogen-containing atmosphere to extend a portion of each of said source and drain regions with said overlying dielectirc layer further into said semiconductor body;
   f. removing said dielectric layer;
   g. filling said contact holes with conductive plugs; and
   h. forming an interconnect layer adjacent said interlevel dielectric layer and said conductive plugs.

14. The method of claim 13, wherein said nitrogen-containing ambient comprises ammonia.

15. The method of claim 13, wherein said annealing step is performed at a temperature less than 850° C. and at a pressure in the range of below atmospheric pressure to 100 atmospheres.

16. The method of claim 13, wherein said annealing step is performed at a pressure in the range of 20 to 100 atmospheres.

17. The method of claim 13, wherein said dielectric layer has a thickness in the range of 100Å–200Å.

18. The method of claim 13, wherein said step of forming said dielectric layer comprises low-pressure chemical-vapor deposition.

19. The method of claim 13, wherein said step of forming said dielectric layer comprises thermally growing said dielectric layer.

20. The method of claim 1, wherein said annealing step diffuses said portion of said at least one junction further into the substrate in a self-aligned manner.

21. The method of claim 13, wherein said annealing step diffuses said portion of each of said source and drain regions further into the substrate in a selfaligned manner.

* * * * *